(12) United States Patent
Huot-Marchand et al.

(10) Patent No.: US 8,558,520 B2
(45) Date of Patent: Oct. 15, 2013

(54) BUS DRIVER FOR AVOIDING AN OVERVOLTAGE

(75) Inventors: Alexis Huot-Marchand, Labarthe sur Leze (FR); Hamada Ahmed, Toulouse (FR); Patrice Besse, Toulouse (FR); Nicolas Jarrige, Colomiers (FR)

(73) Assignee: Freescale Semiconductor, Inc., Austin, TX (US)

( * ) Notice: Subject to any disclaimer, the term of this patent is extended or adjusted under 35 U.S.C. 154(b) by 185 days.

(21) Appl. No.: 13/120,874

(22) PCT Filed: Sep. 30, 2008

(86) PCT No.: PCT/IB2008/055631
§ 371 (c)(1),
(2), (4) Date: Mar. 24, 2011

(87) PCT Pub. No.: WO2010/038107
PCT Pub. Date: Apr. 8, 2010

(65) Prior Publication Data
US 2011/0175592 A1    Jul. 21, 2011

(51) Int. Cl.
*G05F 1/00* (2006.01)
*H02H 3/20* (2006.01)
*H02H 9/04* (2006.01)
*H02H 7/122* (2006.01)

(52) U.S. Cl.
USPC .......... 323/269; 323/272; 323/289; 361/91.1; 363/56.11

(58) Field of Classification Search
USPC ......... 323/223–226, 269, 272, 289; 361/91.1, 361/91.3, 93.1; 363/56.11
See application file for complete search history.

(56) References Cited

U.S. PATENT DOCUMENTS

| | | | |
|---|---|---|---|
| 5,483,177 A * | 1/1996 | Van Lieverloo | 326/27 |
| 5,930,096 A * | 7/1999 | Kim | 358/1.15 |
| 6,169,439 B1 * | 1/2001 | Teggatz et al. | 327/309 |
| 6,324,042 B1 * | 11/2001 | Andrews | 361/93.2 |
| 6,697,241 B1 * | 2/2004 | Smith | 361/91.1 |
| 2002/0071231 A1 * | 6/2002 | Chloupek et al. | 361/91.6 |
| 2002/0118500 A1 * | 8/2002 | Covi et al. | 361/93.1 |
| 2003/0076638 A1 * | 4/2003 | Simonelli et al. | 361/56 |

FOREIGN PATENT DOCUMENTS

| | | |
|---|---|---|
| EP | 0250036 A | 12/1987 |
| EP | 0945983 A | 9/1999 |

OTHER PUBLICATIONS

International Search Report and Written Opinion correlating to PCT/IB2008/055631 dated Jul. 16, 2009.

* cited by examiner

*Primary Examiner* — Adolf Berhane
*Assistant Examiner* — Gary Nash

(57) ABSTRACT

An electrical circuit for manipulating at least one of a voltage and a current on a bus wire comprises a first switch having a first gate, a first source, and a first potential reduction unit. The first potential reduction unit is suitable for lowering a potential difference between the first gate and the first source of the first switch, wherein the lowering of the potential difference is caused by a shutting-off of a first control voltage.

20 Claims, 4 Drawing Sheets

US 8,558,520 B2

BUS DRIVER FOR AVOIDING AN OVERVOLTAGE

FIELD OF THE INVENTION

This invention relates to an electrical circuit for manipulating at least one of a voltage and a current on a bus wire. Further, the invention relates to a method for avoiding an overvoltage on a bus wire.

BACKGROUND OF THE INVENTION

Bus lines may comprise considerable inductivity. In exceptional cases an overvoltage may occur on a bus wire. When, for example, a short cut between a starter battery and the bus wire happens, the magnetic field of the inductivity may be loaded by energy transferred to the inductivity by current on the bus. In conventional systems a short-cut detector is provided to detect occurrence of an exceptional case. When a short-cut is detected an input signal for gate drivers (gate buffers) is generated which causes the output of each gate driver to assume a low state L which forces the respective gate of the transistor to switch the transistor off. The switching-off of the transistor (switch) results in a sudden interrupt of the drain-to-source current, i.e. of the current which until then has been flowing through the inductivity. As a result, the inductivity generates a voltage peak. Conventional circuits limit such voltage peaks by a protection circuit designed therefore. However, as higher the bus inductivity is the higher is the risk that the voltage peak may damage at least one of the bus driver circuit and the overvoltage protection circuit. The energy sink in an ESD overvoltage protection circuit may be high enough to damage the ESD overvoltage protection circuit.

SUMMARY OF THE INVENTION

The present invention provides an electrical circuit and a method as described in the accompanying claims. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawing. Elements in the figures are illustrated for simplicity and clarity and have not necessarily been drawn to scale.

DETAILED DESCRIPTION OF THE PREFERRED EMBODIMENTS

Figure 1:
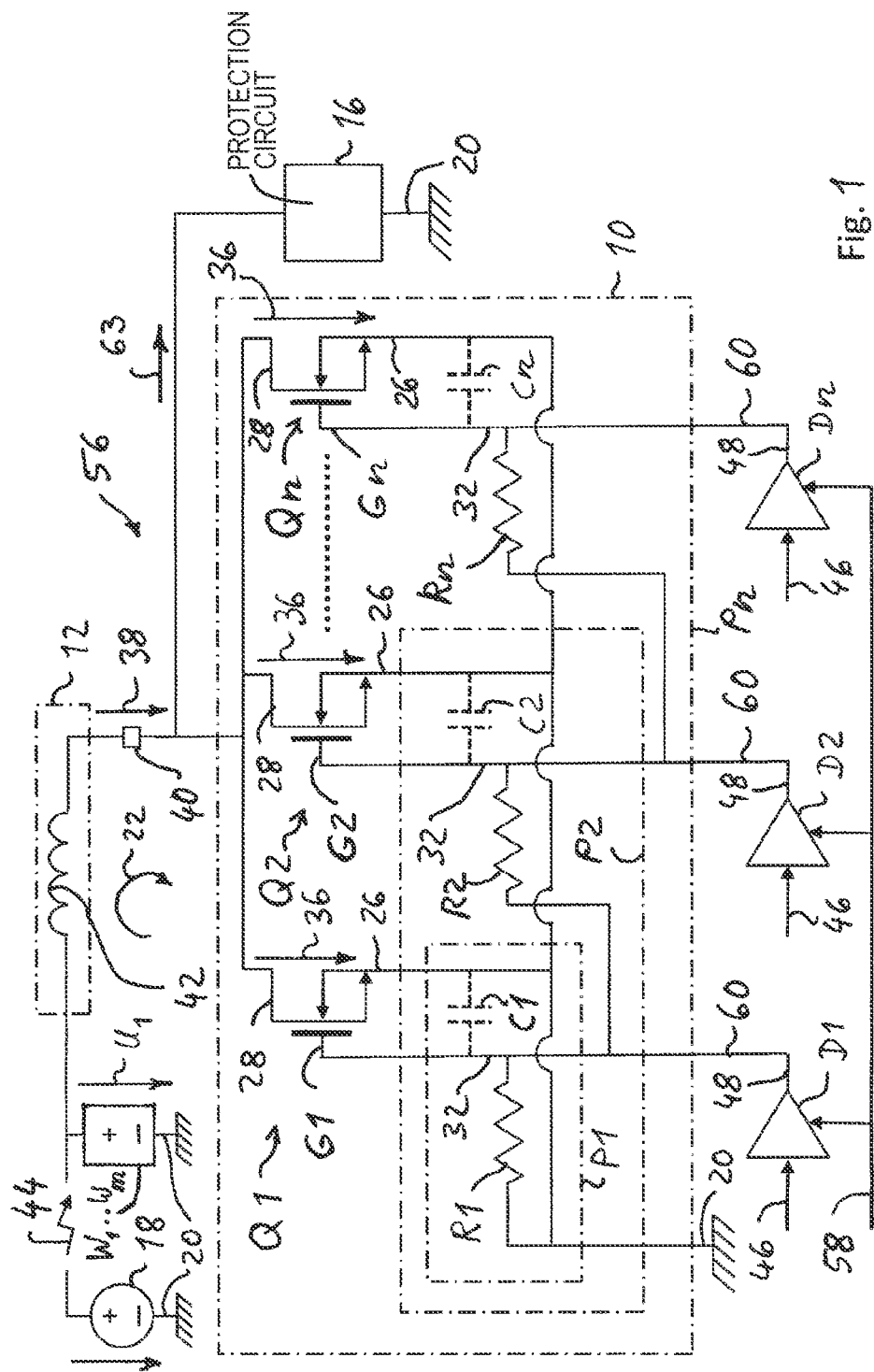
FIG. 1 schematically shows an example of an embodiment of an arrangement comprising an electrical circuit according to the present invention.

The example of an arrangement of FIG. 1 shows a circuit diagram comprising an electrical circuit 10, in particular a bus driver, according to the present invention, a bus wire 12, at least one of transceivers $W_1 \ldots W_m$, a conventional protection circuit 16, and a starter battery 18 of a vehicle (not illustrated). In the preferred embodiment, many transceivers $W_1 \ldots W_m$ are connected to the bus wire 12. The transceivers $W_1 \ldots W_m$ apply on the bus wire 12 a maximum voltage U1 of 5 V in relation to ground 20. The ground 20 is connected to a metal body of the vehicle. Each of the transceivers $W_1 \ldots W_m$, the bus wire 12, and the electrical circuit 10 are connected in series. The electrical circuit 10 has a ground terminal 20 which is connected to the same ground 20 as each of the transceivers $W_1 \ldots W_m$. Therefore, each of the transceivers $W_1 \ldots W_m$, the bus wire 12, the electrical circuit 10, and ground 20, together form a current circle 22. The electrical circuit 10 comprises a multitude of switches $Q1 \ldots Qn$. In this application the notation $X1 \ldots Xn$ represents an enumeration of a multitude of switches Q1 to Qn, wherein Qi represents one of the switches Q1 to Qn. The corresponding notation $X1 \ldots Xn$ applies to other types of components, as designated by other letters as C, D, P, and so on. The switches $Q1 \ldots Qn$ are transistors, in particular MOSFET (Metal Oxid Semiconductor Field Effect Transistors). Each of the switches $Q1 \ldots Qn$ has a source 26, a drain 28, and a gate $G1 \ldots Gn$. All these switches $Q1 \ldots Qn$ are connected in parallel such that all drains 28 of the switches $Q1 \ldots Qn$ are connected and that all sources 26 of the switches $Q1 \ldots Qn$ are connected. Each gate $G1 \ldots Gn$ of each switch $Q1 \ldots Qn$ is separately controlled by an individual control signal 32. The control signal 32 is provided by an individual control voltage source $D1 \ldots Dn$ (gate driver; gate buffer) and supplied to the respective gate $G1 \ldots Gn$. As each of the switches $Q1 \ldots Qn$ is an enhancement-type transistor $Q1 \ldots Qn$ the respective drain-to source current 36 through any of the switches $Q1 \ldots Qn$ remains almost zero until a voltage above a switch-type-specific threshold level is applied to the gate $G1 \ldots Gn$ of the switches $Q1 \ldots Qn$. A further increase of the voltage 32 at the gate $G1 \ldots Gn$ results in increasing the drain-to-source current 36 through the considered switch $Q1 \ldots Qn$. Therefore, by co-ordinately controlling the gate voltages 32 of each of the switches $Q1 \ldots Qn$ the sum 38 of all drain-to-source currents 36 is controlled. Hence, the sum current 38 through the bus wire 12 can be controlled. This functionality can be employed for controlling shapes of signal slopes to facilitate a high speed data transmission or to improve a signal quality of a data transmission on the bus wire 12. By controlling the sum 38 of all drain-to-source currents 36 also a voltage at the output terminal 40 of the electrical circuit 10 is controlled.

The bus wire 12 comprises inductivity of up to 100 μH. In exceptional cases an overvoltage occurs on the bus wire 12. When a short cut 44 between the starter battery 18 and the bus wire 12 happens, while a drain-to-source channel of one of the switches $Q1 \ldots Qn$ is open, the magnetic field of the inductivity 42 is loaded by energy transferred to the inductivity 42 by the current 38 on the bus 12. In such a case one of a short-cut detector and an overvoltage detector (none of both is illustrated in the figure) detects the occurrence of the exceptional operating condition. In conventional arrangements for each control voltage source D1 . . . Dn an input signal 46 is generated which causes the output of each control voltage source D1 . . . Dn to assume a low state L which forces the respective gate G1 . . . Gn of the switches Q1 . . . Qn to switch-off the switches Q1 . . . Qn. The instant switching-off of at least one of the switches Q1 . . . Qn at t1 results in a sudden interrupt of the complete drain-to-source current 38, i.e. of the current 38 until then flowing through the inductivity 42. As a result the inductivity 42 generates a voltage peak at the output terminal 40. In conventional circuits the voltage peak is limited by a protection circuit 16 designed therefore.

FIG. 1 shows an electrical circuit 10 for an additional manipulation of at least one of the voltage and the current 38 on the bus wire 12. The circuit 10 comprises a first switch Q1 having a first gate G1, a first source 26, and a first potential reduction unit P1. The first potential reduction unit P1 is suitable for lowering, in particular smoothly lowering a potential difference between the first gate G1 and the first source 26 of the first switch Q1. The lowering of the potential difference is caused by a shutting-off of a first control voltage source D1. For explanation purposes the figure separately illustrates gate-source capacities C1 . . . Cn of the switches Q1 . . . Qn. In practice, each gate-source capacity C1 . . . Cn is an intrinsic portion of its respective switch Q1 . . . Qn. A first resistor R1 is connected in parallel to the first gate-source capacity C1 of the first switch Q1. Thus the first resistor R1 and the first gate-source capacity C1 form a first timing element P1. Further, the first control voltage source D1 has a tristate output 48. The inventive bus arrangement 56 works as follows. If a short-cut 44 or if an overvoltage is detected by one of the non-illustrated circuits designed therefore, a disable signal 58 is generated for all control voltage sources D1 . . . Dn. Thus, each of the control voltage sources D1 . . . Dn turns into a high impedance state. Then, there is no longer any current on the line 60 from the control voltage source D1 to the switch Q1. Hence, the whole current, which is flowing out of the gate G1, is flowing through the first resistor R1. The only source for this current is the first gate-source capacity C1. The de-loading of the gate-source capacity C1 takes place with a time constant T1=R1C1. In other words, R1 and C1 form a first timing element P1. Hence, the first gate voltage 32 is not switched-off suddenly or binary-like, as with the conventional electrical circuit, but smoothly.

The electrical circuit 10 of FIG. 1 comprises a second switch Q2 having a second gate G2, a second source 26, and a second potential reduction unit P2. The second potential reduction unit P2 is suitable for lowering a potential difference between the second gate G2 and the second source 26 of the second switch Q2. The lowering of the potential difference is caused by a shutting-off of a second control voltage source D2. The second switch Q2 has a second gate-source capacity C2. Further, the second control voltage source D2 has a tristate output 48. The inventive bus arrangement 56 works as follows. When a short-cut 44 or an overvoltage is detected there is no longer any current on the line 60 from the second control voltage source D2 to the second switch Q2. The whole current which is flowing out of the second gate G2 is flowing through a second resistor R2. The only source for this current is the second gate-source capacity C2. The second resistor R2 is not directly connected to ground 20 as the first timing element P1. The second resistor R2 is connected in series with the first resistor R1. Therefore, the de-loading of the gate-source capacity C2 takes place with a time constant of T2=at least (R1+R2) C2. In other words, R1+R2 and C2 form a second timing element P2. Therefore, also the voltage 32 of the second gate G2 is not switched-off suddenly or binary-like, but smoothly and more gradually, i.e. with an even higher time delay t2 than voltage 32 at the first gate G1. Hence, the second potential reduction unit P2 has a higher time constant T2 than the first potential reduction unit P1. The same principle applies correspondingly for the partial circuit of any of the other switches Q3 . . . Qn. In the example of the figure all resistors R1 to Rn have the same value. Therefore, the de-loading of the i-th gate-source capacity Ci takes place with a time constant of Ti=at least n Ri Ci. In other words, each Ci forms together with a chain of resistors R1+ . . . +Ri an i-th timing element Pi. Therefore, the voltage 32 of each individual gate G1 . . . Gn is not switched-off suddenly or binary-like, but smoothly and gradually. Each gate voltage 32 is switched-off with a time delay ti different to the time delay of any other of the voltages 32 of the gates G1 . . . Gn. The second potential reduction unit P2 comprises the first potential reduction unit P1. The resistor R2 of the second potential reduction unit P2 is connected in series with the first potential reduction unit P1. At least one of the first P1 and the second P2 potential reduction unit forms at least a portion of the first respectively second timing element. At least one of the first timing element P1 and the second timing element P2 comprises a first C1 respectively second C2 capacity. At least one of the first P1 and second P2 timing elements comprises a first respectively second RC element. As an alternative or in addition to the resistor R1 respectively R2, the first P1 and the second P2 timing element comprises a first respectively second current source.

Figure 2:
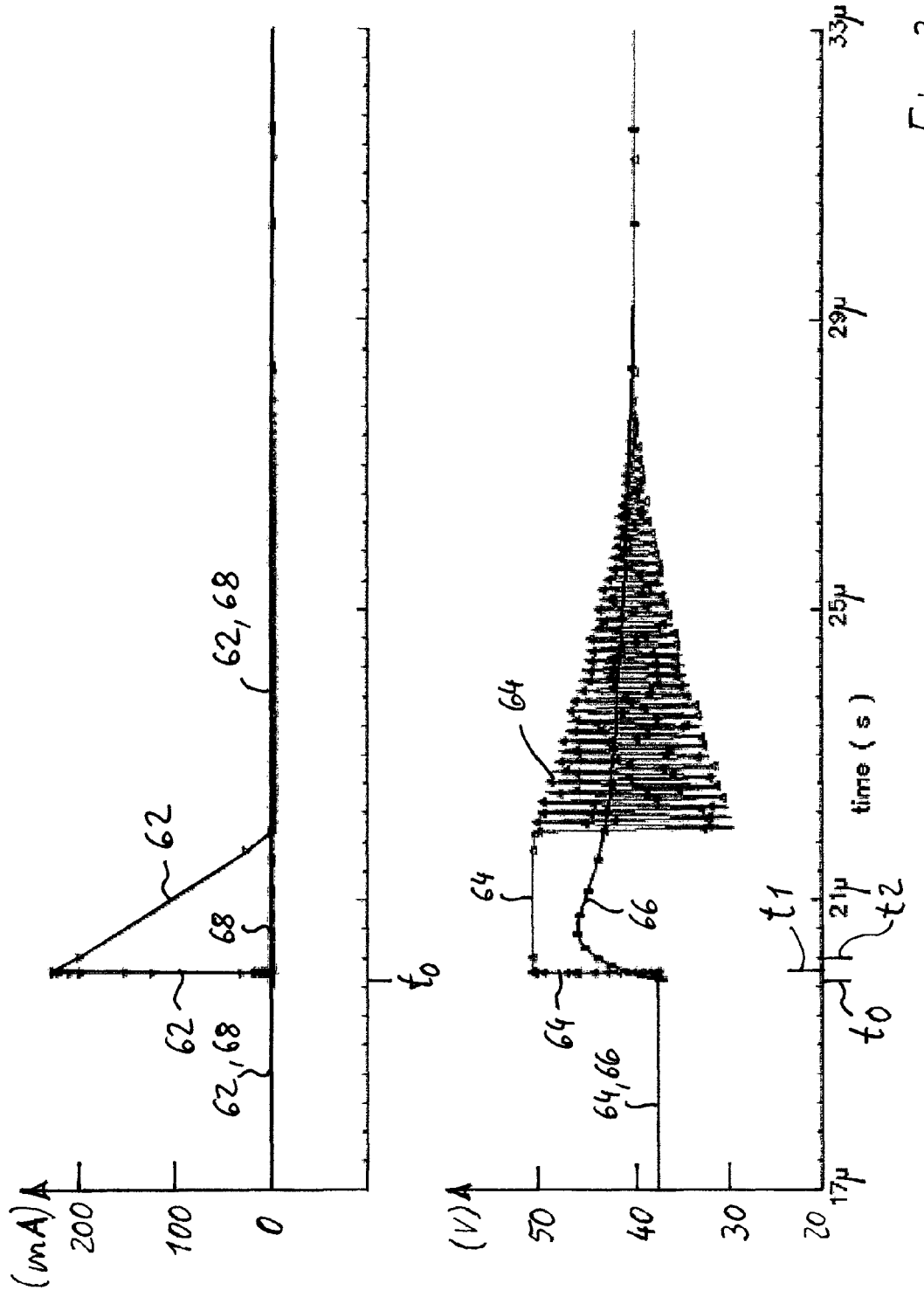
FIG. 2 schematically shows in the upper part a curve of a current through an overvoltage protection circuit when an electrical circuit according to an example of an embodiment of the present invention is employed in comparison to a current through the overvoltage protection circuit when an electrical circuit according to prior art is employed. Further, the figure shows in the lower part a voltage at an output terminal when an electrical circuit according to an example of an embodiment of the present invention is employed in comparison to a voltage at the output terminal when an electrical circuit according to prior art is employed.

The upper part of FIG. 2 shows by curve 62 how much current 63 is flowing through the protection circuit 16 when a voltage peak occurs on the bus wire 12. The lower part of the figure shows by curve 64 the value of the voltage at the output terminal 40 of a conventional electronic circuit. Here the voltage at the output terminal 40 remains at the limit of 50 V for 2.5 μs until the current 63 through the protection circuit 16 has decreased considerably (see curve 62). Moreover, the lower part of the figure shows a curve 66 of the voltage on the bus 12 at the output terminal 40 of the inventive electrical circuit 10. The maximum of this voltage curve is 45 V which is below the voltage limit of 50 V, above which the overvoltage-protection circuit 16 would have started working. The curve 68 in the upper part of the figure shows that the value of the current 63 through the overvoltage protection circuit 16 remains a zero value. This is a proof that with the inventive circuit 10 the overvoltage-protection circuit 16 is not active when the considered type of overvoltage occurs. Overvoltages are avoided by the inventive circuit 10 by switching off each of a multitude (i.e. at least one) of switches Q1 . . . Qn smoothly and one by one. For applications where a special turn-off scheduling between the switches Q1 . . . Qn is desired, the resistance values of the individual resistors R1 . . . Rn may be designed such that they differ to each other.

Figure 3:
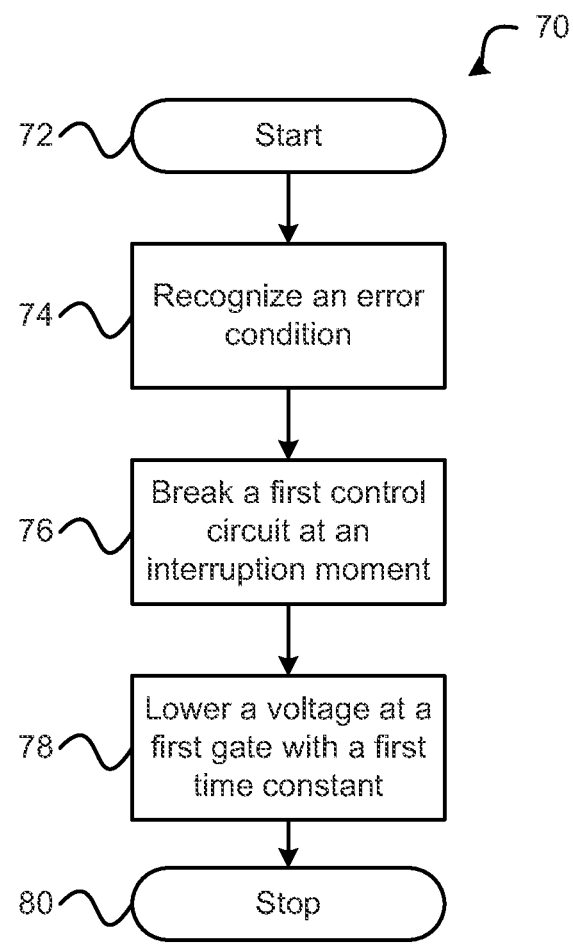
FIG. 3 schematically shows a flow diagram of an example of a first embodiment of a method for avoiding an overvoltage.

FIG. 3 schematically shows a flow diagram of an example of a first embodiment of a method 70 for avoiding an overvoltage on a bus wire 12. After a start 72, the method 70 comprises firstly a step 74 of recognizing an error condition, secondly a step 76 of breaking a first control circuit 60 of a first gate G1 of a first switch Q1 at an interruption moment t1 when the first gate G1 is supplied via the first control circuit 60 with a first control voltage 32, and thirdly a step 78 of lowering a voltage 32 at the first gate G1 with a first time constant T1. A stop 80 closes the procedure.

The electric circuit 10 is designed to perform a method 70 of a slow passive deactivation of at least one individual switch Qi in case of a failure detection, a short circuit, or an over current. Thereby, the switch Qi is used to dissipate energy during turn off which has been stored in a magnetic field of bus inductivity 42. Hence, a size of a total driver portion of the bus arrangement 56, wherein the driver portion includes the protection circuit 16, is kept small, without adding additional clamp circuitry. Further, a safe operating area can be increased.

Figure 4:
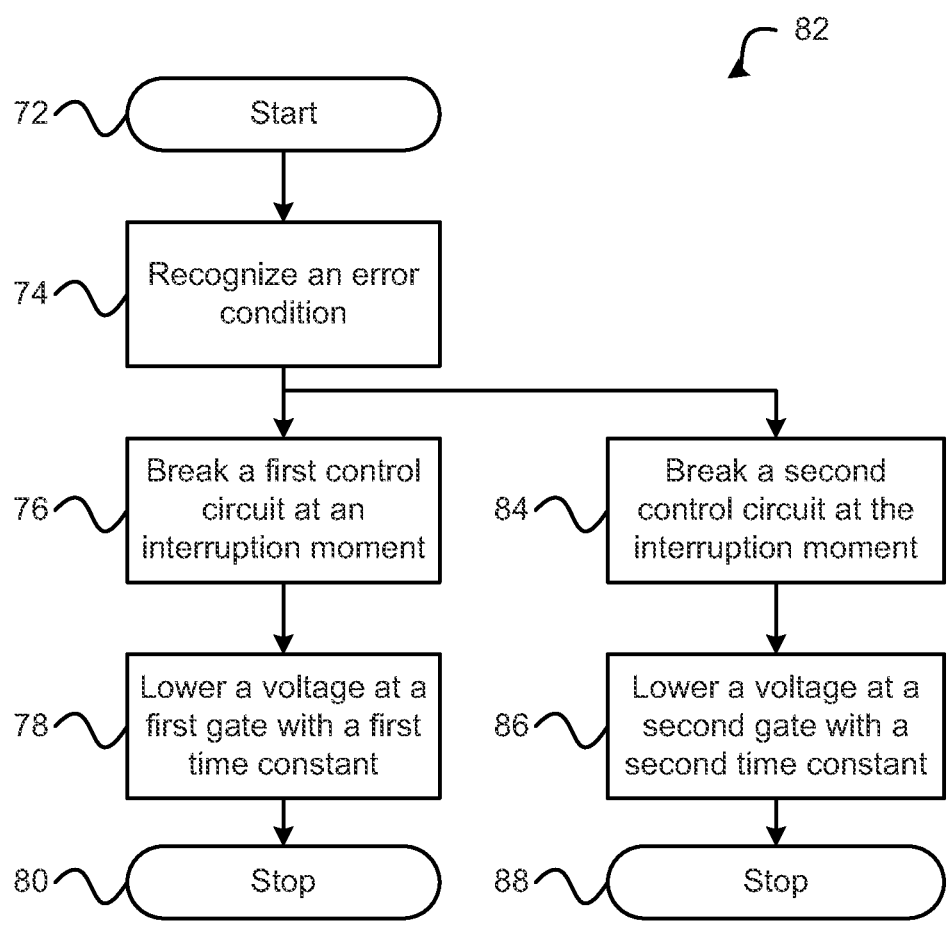
FIG. 4 schematically shows a flow diagram of an example of a second embodiment of a method for avoiding an overvoltage.

FIG. 4 schematically shows a flow diagram of an example of a second embodiment 82 of the method 70 for avoiding an overvoltage. The method 82 comprises the same stops 72 and 80, and method steps 74, 76, and 78 in a same sequence as illustrated in FIG. 3. In addition, the method 82 comprises a second process 84, 86, 88. After step 74 has been performed, the second process is performed in parallel to the performing of method steps 76 and 78. In a step 84, at the interruption moment t1, a breaking of a second control circuit 60 of a second gate G2 of a second switch Q2 takes place when the second gate G2 is supplied via the second control circuit 60 with a second control voltage 32. Afterwards, a step 86 of lowering a voltage 32 at the second gate G2 with a second time constant T2 being higher than the first time constant T1 is performed.

In an embodiment, the electric circuit 10 is designed to perform—in case of a failure detection, a short circuit, or an over current—a method 82 of an individual slow passive deactivation with an individual time constant for each individual switch Qi of a multitude of switches Q1 . . . Qn.

The electronic circuit 10 and the methods 70, 82 are particularly applicable in automotive products, in products using or having switches, and communication busses, as e.g. MSC2, PCUxx, CANVAS, MANDO projects. The electronic circuit 10 needs no extra clamp circuit, has a compact design, and can be easily simulated.

While the principles of the invention have been described above in connection with specific apparatus, it is to be clearly understood that this description is made only by way of example and not as a limitation on the scope of the invention. In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

As used herein, the term "bus" is used to refer to a plurality of signals or conductors which may be used to transfer one piece of data or signalling. The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an example of an information processing architecture, this example of an architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely examples, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of electrical circuit 10 are circuitry located on a single integrated circuit or within a same device. Alternatively, electrical circuit 10 may include any number of separate integrated circuits or separate devices interconnected with each other. Also for example, electrical circuit 10 or portions thereof may be soft or code representations of physical circuitry or of logical representations convertible into physical circuitry. As such, electrical circuit 10 may be embodied in a hardware description language of any appropriate type.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device. For example, a subset or all of the control voltage sources D1 . . . Dn may be arranged in one single device or in one integrated circuit. Optionally, even the electrical circuit 10 may be arranged in one single device together with one or more of the control voltage sources D1 . . . Dn.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electrical circuit for manipulating at least one of a voltage and a current on a bus wire, wherein the circuit comprises:
   a first switch having a first gate, a first source, and a first potential reduction unit, wherein the manipulating of the at least one of a voltage and a current on the bus wire is controllable by a change of a gate voltage at the first gate, wherein the first potential reduction unit is suitable for lowering a potential difference between the first gate and the first source of the first switch, wherein the lowering of the potential difference is causable by turning an output of a first control voltage source into an high-impedance state; and
   a second switch having a second gate, a second source, and a second potential reduction unit, wherein the second potential reduction unit is suitable for lowering a potential difference between the second gate and the second source of the second switch, wherein the lowering of the potential difference is caused by a shutting-off of a second control voltage.

2. The electrical circuit as claimed in claim 1, wherein the second potential reduction unit has a higher time constant than the first potential reduction unit.

3. The electrical circuit as claimed in claim 2, wherein the second potential reduction unit comprises the first potential reduction unit.

4. The electrical circuit as claimed in claim 2, wherein a resistor of the second potential reduction unit is connected in series with the first potential reduction unit.

5. The electrical circuit as claimed in claim 2, wherein at least one of the first potential reduction unit and the second potential reduction unit forms at least a portion of respective first and second timing elements.

6. The electrical circuit as claimed in claim 2, wherein at least one of the first and second potential reduction unit forms at least a portion of a first respectively second timing element.

7. The electrical circuit as claimed in claim 1, wherein the second potential reduction unit comprises the first potential reduction unit.

8. The electrical circuit as claimed in claim 7, wherein a resistor of the second potential reduction unit is connected in series with the first potential reduction unit.

9. The electrical circuit as claimed in claim 7, wherein at least one of the first and second potential reduction unit forms at least a portion of a first respectively second timing element.

10. The electrical circuit as claimed in claim 1, wherein a resistor of the second potential reduction unit is connected in series with the first potential reduction unit.

11. The electrical circuit as claimed in claim 1, wherein at least one of the first potential reduction unit and the second potential reduction unit forms at least a portion of respective first and second timing elements.

12. The electrical circuit as claimed in claim 11, wherein at least one of the first and second timing elements comprises a first respectively second capacity.

13. The electrical circuit as claimed in claim 12, wherein at least one of the first and second timing elements comprises a first respectively second RC element.

14. The electrical circuit as claimed in claim 13, wherein at least one of the first and second timing elements comprises a first respectively second current source.

15. The electrical circuit as claimed in claim 12, wherein at least one of the first and second timing elements comprises a first respectively second current source.

16. The electrical circuit as claimed in claim 11, wherein at least one of the first and second timing elements comprises a first respectively second current source.

17. The electrical circuit of claim 1, wherein the first switch is an NMOS transistor.

18. A method for avoiding an overvoltage on a bus wire, wherein the method comprises:
   recognizing an error condition;
   breaking a first control circuit of a first gate of a first switch at an interruption moment when the first gate is supplied via the first control circuit with a first control voltage by turning an output of a first control voltage source into an high impedance state;

lowering a voltage at the first gate with a first time constant;

breaking a second control circuit of a second gate of a second switch, at the interruption moment when the second gate is supplied via the second control circuit with a second control voltage; and lowering a voltage at the second gate with a second time constant being higher than the first time constant.

19. The method of claim 18, wherein the first switch is an NMOS transistor.

20. An electrical circuit for manipulating at least one of a voltage and a current on a bus wire, wherein the electrical circuit comprises:

a voltage supply having a first terminal coupled to the bus wire, and a second terminal coupled to a voltage reference, wherein the voltage reference is a ground;

a protection circuit having a first terminal coupled to the bus wire, and a second terminal coupled to the voltage reference;

a switch having a first current electrode coupled to the bus wire, a second current electrode coupled to the voltage reference, and a control electrode; and a potential reduction unit including a gate-source capacitor of the switch, and a resistor having a first terminal coupled to the control electrode of the switch and a second terminal coupled to the voltage reference, wherein the manipulating of the at least one of the voltage and the current on the bus wire is controllable by a change of a control voltage at the control electrode of the switch, wherein the potential reduction unit is suitable for lowering a potential difference between the control electrode and the second current electrode of the switch, wherein the lowering of the potential difference is causable by turning an output of a first control voltage source into an high-impedance state.

* * * * *